United States Patent [19]

Shiozawa et al.

[11] 4,269,494

[45] May 26, 1981

[54] BATTERY LEVEL WARNING DEVICE

[76] Inventors: Kazuo Shiozawa, 6-46-5, Tamadaira, Hino-shi, Tokyo; Michio Yagi, 1526-42 Yamada-cho, Hachioji-shi, Tokyo; Kijiro Suzuki, 2-1-5 Shinmeidai, Hamura-cho, Nishitama-gun, Tokyo; Kazuhisa Aratame, 2-5-10 Ohowada-cho, Hachioji-shi, Tokyo; Ryushi Shimokawa, 1-30 Nishifu-cho, Fuchu-shi, Tokyo; Haruji Ishihara, 1503 Josuihon-cho, Kodaira-shi, Tokyo, all of Japan

[21] Appl. No.: 924,010

[22] Filed: Jul. 12, 1978

[30] Foreign Application Priority Data

Jul. 18, 1977 [JP] Japan ................................. 52/85038

[51] Int. Cl.$^3$ ........................ G03B 7/26; G03B 17/18; G03B 17/38
[52] U.S. Cl. ................................. 354/60 L; 354/268; 354/289
[58] Field of Search ..................... 354/53, 60 R, 60 E, 354/60 A, 60 L, 289, 23 D, 284, 266–268, 235, 50, 51; 320/48; 324/29.5; 340/636, 663; 352/170, 171

[56] References Cited

U.S. PATENT DOCUMENTS

| | | | |
|---|---|---|---|
| 3,947,855 | 3/1976 | Inoue et al. | 354/60 R X |
| 3,956,758 | 5/1976 | Numata et al. | 354/53 |
| 3,979,657 | 9/1976 | Yorksie | 340/636 X |
| 4,027,231 | 5/1977 | Lohrmann | 324/29.5 |
| 4,089,012 | 5/1978 | Kawasaki | 354/60 L X |
| 4,114,176 | 9/1978 | Kawasaki | 354/289 |
| 4,126,874 | 11/1978 | Suzuki et al. | 354/60 R |
| 4,190,344 | 2/1980 | Ishiguro et al. | 354/234 |

Primary Examiner—L. T. Hix
Assistant Examiner—William B. Perkey
Attorney, Agent, or Firm—Craig and Antonelli

[57] ABSTRACT

Battery voltage level warning is made according to the output signals of two detecting circuits. A first detecting circuit detects the power supply voltage having lowered to a value somewhat above the lower limit of the operation power supply voltage of an electronic system. The output thereof supplies weak battery warning. The second detecting circuit detects the power supply voltage having lowered to the lower limit level of said operation power-supply voltage. The output thereof prohibits the operation of said electronic system. Thereby, desirable battery-replacement times becomes clarified and the malfunction of said electronic system is prevented.

12 Claims, 8 Drawing Figures

BATTERY LEVEL WARNING DEVICE

BACKGROUND OF THE INVENTION

The present invention relates to a level warning device, particularly a power-supply-level warning device for the electronic systems employing a battery power source.

The general idea that a battery check circuit can be adopted in the electronic systems employing batteries, such as the electronic-control shutter mechanisms of cameras, for the weak-battery display of light emitting diodes (called LEDs hereinunder) is already known as introduced under the title "A Single-Chip, Al- Bipolar, Camera Control IC" on IEEE International Solid-State Circuit Conference 1977 February issue pages 214–215.

A battery check can be performed by measuring the power supply voltage since the electromotive force of batteries decreases in accordance with the power consumption thereof.

Weak battery warning should be preferably supplied before the electromotive force of batteries comes down to a low level where the normal operation of such an electronic system is affected.

The check level, therefore, should be preferably set to a low level somewhat above the lower limit of the operation power-supply voltage of the electronic system.

Thereby, the electronic system can be prevented from abnormal operation immediately before and after the start of a warning and can be kept in normal operation for the remaining period before battery replacement time when the warning is started for replacing batteries. Therefore, the operation and maintenance of the electronic system can be facilitated.

The electronic system, however, cannot sufficiently be prevented from the abnormal operation owing to power supply voltage by using only the above-mentioned battery check circuit and by only setting the check level thereof as described above.

SUMMARY OF THE INVENTION

The main object of the present invention is to provide a level warning device for preventing the abnormal operation owing to the power supply voltage of electronic systems.

Another object of the invention is to present an easy-to-use level warning device.

A further object of the invention is to provide a level warning device suitable for monolithic semiconductor integrated circuits (IC).

Still a further object of the invention is to provide a level warning device with simplified circuitry.

The level warning device of the invention includes a first means for detecting a low voltage level somewhat above the lower limit of the operation power-supply voltage of an electronic system and a second means for detecting the operation power-supply voltage level almost equal to the lower limit thereof.

The detection signal of said first detecting means is used to drive warning means such as LEDs.

The detection signal of said second detecting means is used to prohibit the operation of the electronic system.

Namely, in the present invention, weak-battery warning is supplied on the first step of the drop of power supply voltage and the operation of the electronic system is prohibited on the second step where the operational power-supply voltage comes down to the lower limit thereof so that the normal operation of the electronic system is assured during the warning period.

There is no special restriction as to the construction for prohibiting the operation of said electronic system. It should be understood, however, that the construction of the level warning device that is made so as to prohibit the operation of said electronic system substantially by doing the same for either at least of the input and output signals with a gate means is generally easier than the other constructions thereof as indicated in the later-described embodiments of the invention.

DESCRIPTION OF THE PREFERRED EMBODIMENTS

Figure 1:
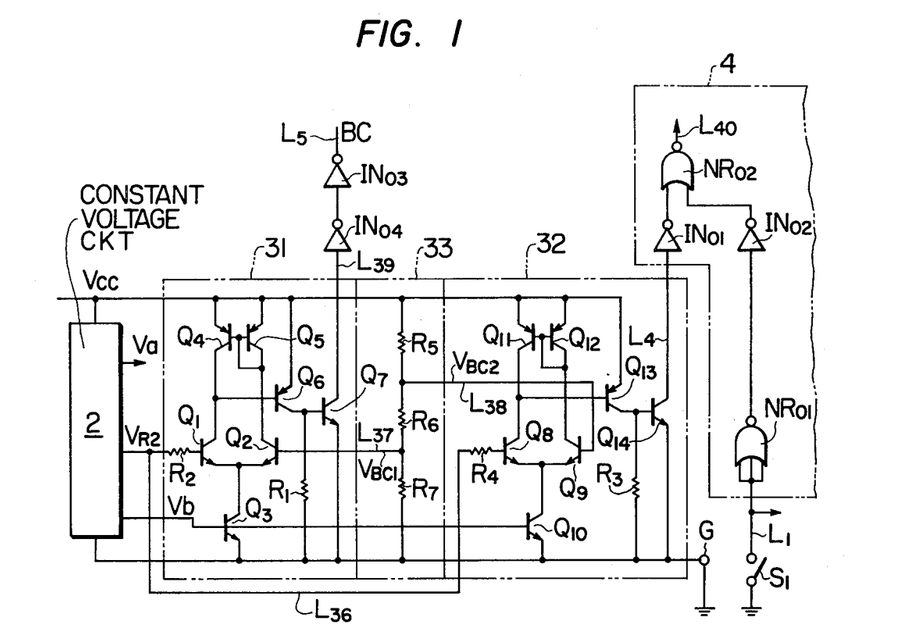
FIG. 1 is a circuit diagram showing the circuit arrangement of a first embodiment of the invention.

FIG. 1 is a circuit diagram showing an embodiment of the present invention.

In FIG. 1, Numerals 31, 32, 33 and 2 are first and second comparating circuits, a voltage dividing circuit and a constant voltage circuit, respectively.

The voltage dividing circuit 33 comprises resistors $R_5$–$R_7$ connected in series both to a power source $V_{CC}$ and the reference potential point G thereof. The output voltages $V_{BC1}$ and $V_{BC2}$ are proportionate to the voltage of the power source $V_{CC}$ as represented by the following equations (1) and (2).

$$V_{BC1} = V_{CC} \cdot R_7/(R_5+R_6+R_7) \quad (1)$$

$$V_{BC2} = V_{CC} \cdot (R_6+R_7)/(R_5+R_6+R_7) \quad (2)$$

The constant voltage circuit 2 is connected both to $V_{CC}$ and the reference potential point G to generate constant voltages $V_a$, $V_b$, $V_{R1}$ and $V_{R2}$. The voltages $V_a$, $V_b$ and $V_{R1}$ are used as the bias source for the later-described circuit, and $V_{R1}$ as the comparating voltage for the voltage comparating circuits.

Figure 2:
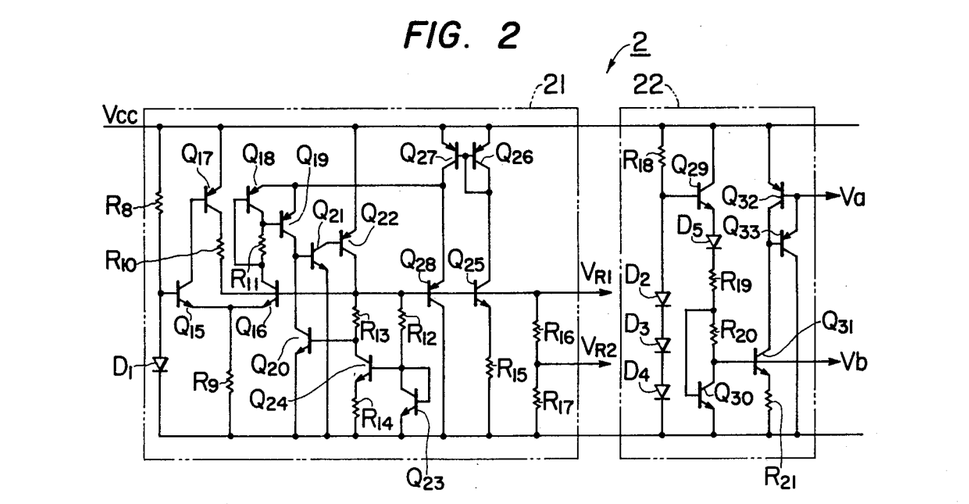
FIG. 2 is a circuit diagram showing a practical circuit arrangement of a constant-voltage circuit as incorporated in the circuit of FIG. 1.

There is no special restriction as to the construction of said constant voltage circuit 2. The constant voltage circuit 2, however, can have such a construction as shown in FIG. 2 for example. The circuit 2 comprises first and second circuits 21 and 22.

In the first circuit 21, resistors $R_{12}$ and $R_{14}$ as well as a transistor $Q_{24}$ and a diode-connected transistor $Q_{23}$ construct a constant current circuit and lets constant current flow in a resistor $R_{13}$. Further, resistors $R_9$ and $R_{11}$ as well as transistors $Q_{16}$, $Q_{18}$ and $Q_{19}$ construct the constant current load of a transistor $Q_{20}$.

In the circuit 21, the variation of the output voltage $V_{R1}$ is applied to the base of the transistor $Q_{20}$ through the resistor $R_{13}$ wherein a constant voltage drop has occurred, and thus-obtained variation of collector current to the base of a control transistor $Q_{22}$ through a transistor $Q_{21}$. Consequently, the output voltage $V_{R1}$ is made constant. The dividing circuit comprising resistors $R_{16}$ and $R_{17}$ serves to obtain said constant voltage $V_{R2}$ from said constant voltage $V_{R1}$.

A resistor $R_{15}$ and transistors $Q_{25}$–$Q_{27}$ supply constant current to the emitter of a transistor $Q_{28}$. The emitter potential of the transistors $Q_{18}$ and $Q_{19}$ is made constant with respect to the output potential $V_{R1}$ by the transistor $Q_{28}$ regardless of the variation of power supply voltage $V_{CC}$. Resistors $R_8$ and $R_{10}$, transistors $Q_{15}$ and $Q_{17}$, and a diode $D_1$ are provided to start the circuit. On starting, the transistor $Q_{15}$ is set to ON by the base bias generated by the resistor $R_8$ and diode $D_1$ so that starting current is supplied to the base of the transistor $Q_{16}$ from the power source $V_{CC}$ through the transistor $Q_{17}$ and resistor $R_{10}$. In stable condition, the output constant voltage $V_{R1}$ is set larger than the regular direction voltage of the diode $D_1$ so that the transistors $Q_{15}$ and $Q_{17}$ are set to OFF after starting.

The circuit 22 comprises resistors $R_{18}$–$R_{21}$, transistors $Q_{29}$–$Q_{33}$, and diodes $D_2$–$D_5$. The voltages $V_b$ and $V_a$ become constant with respect to the potential at the reference potential point of the circuit and the power supply voltage $V_{CC}$ respectively.

In designing, said constant voltages $V_{R1}$ and $V_{R2}$ are set comparatively low so as to display a constant voltage characteristic even when lowering to the lower limit value of the operation power-supply voltage of the electronic system.

The first and second voltage comparating circuits 31 and 32 have similar constructions. The first voltage comparating circuit 31 comprises differential pair transistors $Q_1$ and $Q_2$, a transistor $Q_3$ connected to the common emitter thereof to construct a constant-current suction circuit, a diode-connected pnp transistor $Q_5$, pnp transistors $Q_4$ and $Q_6$, an output npn transistor $Q_7$, and a resistor $R_1$. Said constant current transistor $Q_3$ receives base bias voltage $V_b$ from the constant voltage circuit 2. The differential pair transistor $Q_1$ receives reference voltage $VR_2$ from the constant voltage circuit 2 through a resistor $R_2$, and the differential pair transistor $Q_2$ receives the divided voltage $V_{BC1}$ from the voltage dividing circuit 33.

When the voltage $V_{BC1}$ is higher than the voltage $V_{R2}$, the collector current of the differential pair transistor $Q_1$ is smaller than that of the differential $Q_2$ because the base potential of the differential pair transistor $Q_2$ is higher than that of the differential pair transistor $Q_1$. Consequently, the transistors $Q_7$ and $Q_8$ are almost in OFF-conditions, since the voltage between the emitter and the collector of the transistor $Q_4$, which is biased by the transistors $Q_1$ and $Q_2$, has a small value.

There is no special restriction as to the construction of the inverter circuit INO4. In the embodiment, however, the circuit is so constructed as to have a biasing means at the input end thereof like IIL (integrated injection logic). The collector of said transistor $Q_7$ receives bias from the input end of the inverter circuit INO4 so that the collector potential thereof is at a high level in said OFF condition.

On the contrary, the transistors $Q_6$ and $Q_7$ are set to ON when the voltage $V_{BC1}$ becomes lower than the voltage $V_{R2}$. In this condition, the collector potential of the transistor $Q_7$ is set to a low level.

Because the output voltage $V_{BC1}$ of the voltage dividing circuit 33 is proportionate to the power supply voltage $V_{CC}$ as represented by said equation (1), the output level of the first-voltage comparating circuit 31 depends on the power supply voltage $V_{CC}$. The power supply voltage $V_{CC1}$ for the inversion of the output level of the voltage comparating circuit 31 is given by the following equation (3).

$$V_{CC1} = V_{R2} \cdot (R_5 + R_6 + R_7)/R_7 \tag{3}$$

The second-voltage comparating circuit 32 receives the reference voltage $V_{R2}$ from the constant voltage circuit 2 and the divided voltage $V_{BC2}$ from the voltage dividing circuit 33. The collector potential of the output transistor $Q_{14}$ thereof is at a high or low level when the power supply voltage $V_{CC}$ is higher or lower than the voltage $V_{CC2}$ represented by the following equation (4).

$$V_{CC2} = V_{R2} \cdot (R_5 + R_6 + R_7)/(R_6 + R_7) \tag{4}$$

As clarified when the equations (3) and (4) are compared, the power-supply detection level $V_{CC1}$ in the first-voltage comparing circuit 31 is higher than that $V_{CC2}$ in the second voltage comparing circuit 32.

In the embodiment, the first-voltage detection level $V_{CC1}$ and the second-voltage detection level $V_{CC2}$ are equalized to the voltage of the batteries which have consumed a fixed quantity of power and to the lower limit value of the operating voltage of another electronic circuit respectively so as to detect the state of the batteries which have consumed a fixed quantity of power and that of the batteries whose voltage has lowered to the lower limit value of the electronic circuit respectively.

In the embodiment, display unit is driven to make a fixed mode of display according to the first detection output, and the signal from the electronic circuit or the output to the electronic circuit, etc. are prohibited according to second detection output. Namely, the electronic circuit is prevented from its starting operation by prohibiting the output of the switch signal for starting the electronic circuit for example by means of said second detection output, to prohibit the output thereof. This is because the normal operation thereof cannot be guaranteed when the power supply voltage $V_{CC}$ is at the lower limit value of the operation voltage of the electronic circuit.

The NOR circuits NR01 and NR02, inverter circuits IN01 and IN02, etc. serve as the gate circuits therefor. Therein, high and low voltage levels correspond to logical signals "1" and "0" respectively.

When the power supply voltage $V_{CC}$ is higher than said second detection level $V_{CC2}$, the signal fed to the NOR circuit NR02 through the inverter circuit IN01 is "0" and the NOR circuit NR02 is open. The NOR circuit NR02, therefore, generates output signal "1" or "0" corresponding to the ON or OFF respectively of a switch $S_1$.

When the power supply voltage $V_{CC}$ has lowered below the voltage $V_{CC2}$, the output signal from the inverter circuit IN01 becomes "1" so that the output signal of the NOR circuit NR01 becomes "0" whether the switch $S_1$ is set to ON or OFF.

In case that the present invention is applied to the battery-level check circuit of a camera circuit, the first-voltage detection output BC and second-voltage detection output of an inverter circuit IN03 in said embodiment are used as the signal for driving the LEDs, etc., and gate signal for prohibiting the input of a release switch respectively for example.

In an electronic circuit of a camera, the aperture, shutter speed and other data obtained through calculation are displayed by a display means such as LEDs. The numerals that can be used by such a display means are limited. Therefore, the information display means of a camera should be preferably used in common for the data display and the warning display be said level check circuit.

Figure 3:
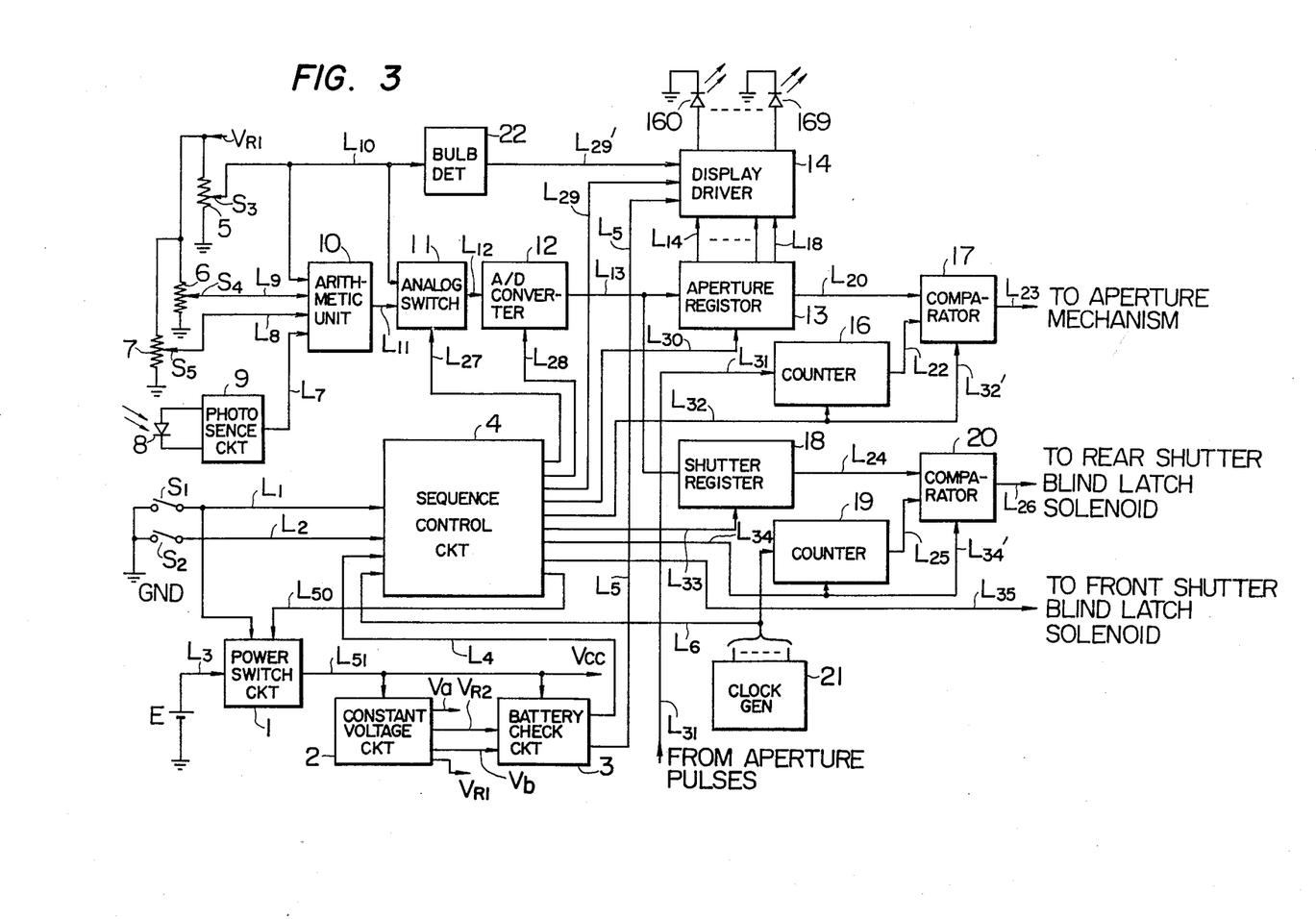
FIG. 3 is a block diagram of an embodiment of the invention incorporated in a shutter-preferential type electronic camera.

Shown in FIG. 3 is an embodiment block in the electronic circuit for a shutter-speed priority type camera wherein aperture is controlled according to photometry, etc.

$S_1$ and $S_2$ are the release switches interlocked with the release button of the camera. When the release button is depressed lightly, only the release switch $S_1$ is set to ON and, when the release button is depressed strongly, the release switch $S_2$ is also set to ON.

When the release switch $S_1$ is pressed to ON, the preparation of data is started in circuits for controlling the camera. When the release switch $S_2$ is set to ON, photographical operations such as shutter operation is commenced.

Figures 4, 5:
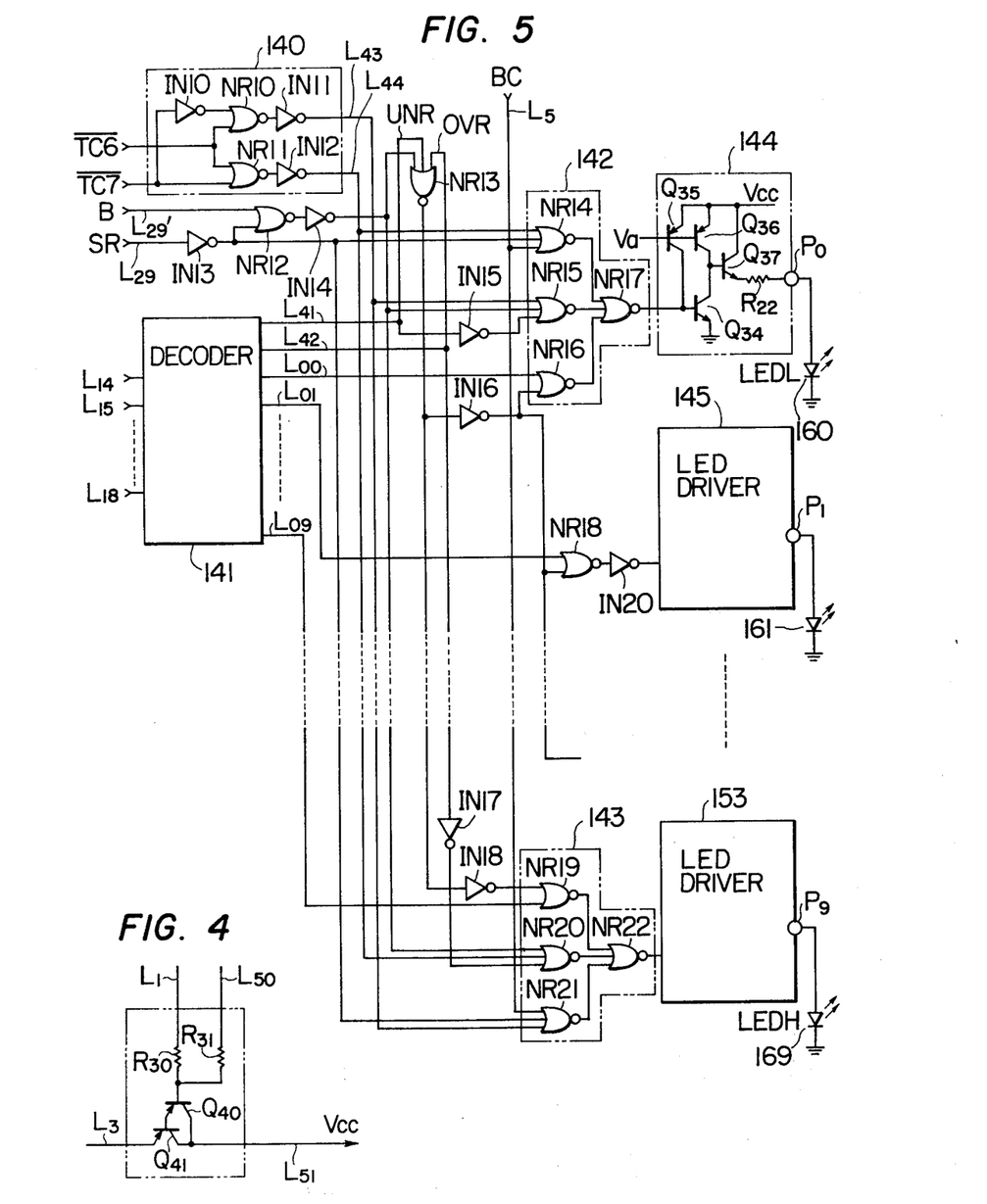
FIG. 4 is a circuit diagram of an example of a power switch circuit incorporated in the circuit as shown in FIG. 1.
FIG. 5 is a circuit diagram of an example of a display driver incorporated in the circuit as shown in FIG. 1, and FIGS. 6A to 6C are illustrations of wave forms of signals available at respective parts of the circuit as shown in the foregoing drawings.

The release switch $S_1$ is connected to the input terminal of a sequence control circuit 4 and to a power switch circuit 1. When the release switch $S_1$ is set to ON, a line $L_1$ is connected to the reference potential point G of a circuit so that the power switch circuit 1 comprising transistors $Q_{40}$ and $Q_{41}$ as well as resistors $R_{30}$ and $R_{31}$ as illustrated in FIG. 4 in details is set to ON. At this time, the power supply voltage of a battery E is supplied to a line $L_{51}$, and to various circuits through the line $L_{51}$. The switch signal is applied to the power switch circuit 1 through a line $L_{50}$ by a sequence control circuit 4 to prevent the stoppage of the feed of power supply voltage during sequence control operation.

Numeral 5 designates a shutter-speed setting variable resistor which receives the constant voltage $V_{R1}$ of the constant voltage circuit 2 by one end thereof. The position of the slide switch contact $S_3$ is mechanically determined by hand. Consequently, the DC voltage corresponding to shutter speed display appears on a line $L_{10}$.

Numeral 6 designates a variable resistor for feeding the voltage corresponding to the opening F number of a lens to a line $L_9$.

Numeral 7 is a variable resistor for feeding the voltage corresponding to the ASA sensitivity of the photographic film in use to a line $L_8$.

Numerals 8 and 9 designate a photodiode for photometry and a photosensing circuit. The voltage corresponding to photometry is supplied from the photosensing circuit 9.

Numeral 10 is an arithmetic unit which receives shutter speed signal from the line $L_{10}$, opening F number signal from the line $L_9$, ASA sensitivity signal from the line $L_8$, and photometric signal from the line $L_7$ as input signals. The arithmetic unit 10 subjects said input signals to analog computation and feeds a line $L_{11}$ with the optimum aperture information as analog signal for obtaining a proper exposure according to photographic characteristic curve.

Numeral 11 is an analog switch circuit which transfers to a line $L_{12}$ the shutter speed signal in said line $L_{10}$ or the optimum aperture signal in a line $L_{11}$ alternately according to the switch control signal applied from the sequence control circuit 4 through a line $L_{27}$.

Numeral 12 is an analog-to-digital converter which generates digital signal according to the analog signal applied to the line $L_{12}$ with the conversion operation thereof controlled according to the control signal applied thereto from the sequence control circuit 4 through a line $L_{28}$.

Numeral 13 designates an aperture register which reads and stores the digital-converted optimum aperture signal according to the control signal applied thereto from the sequence control circuit 4 through a line $L_{30}$ when the analog-to-digital converter 12 supplied the optimum aperture signal. The register 13 is not specially limited in the quantity of bits and comprises five bits for example.

Numeral 14 indicates a display driver which makes the round-off operation of said digital optimum-aperture signal received from said register 13 through lines $L_{14}$–$L_{18}$ to drive 10 LEDs 160–169.

The camera is required to employ a lens with a brightness of F1.4 or an aperture mechanism with a maximum aperture of F22 for example.

Said LEDs 160–169 are arranged linearly. Of the LEDs, the one 160 placed at one end is used to display F1.4, and the other after 161 (not illustrated), inclusive, to display a larger F-number in order. The one placed at the other end, LED 169, is used to display the largest F-number, i.e. F22.

As clarified by referring to FIG. 5 Circuit Diagram, which is described later, LEDs 160 and 169 at one and the other ends are also used to display underexposure and overexposure respectively. These displays are distinguished from ordinary F-number display by the flickering thereof.

For example, the LED 160 flickers when the five-bit digital signal in the aperture register 13 displays a smaller value than the digital number corresponding to the minimum F-number determined depending on the lens in use, and the LED 169 in the case of overexposure. When the aperture register 13 stores the digital signal corresponding nearly to F21 for example, the LED corresponding to F22, i.e. 169, lights continuously owing to said round-off operation of the display driver 14.

Said display driver 14 is controlled according to the control signals from the sequence control circuit 4 and battery check circuit 3 as stated later.

Numeral 16 is a counter controlled according to the control signal from the sequence control circuit 4.

Numeral 17 designates a comparator which receives the outputs of said aperture register 13 and counter 16. The output thereof is supplied to a line $L_{23}$ to drive an aperture mechanism (not illustrated).

When an instruction for the operation start of the aperture mechanism is supplied from the sequence control circuit 4, said comparator 17 compares the memories of the aperture register 13 and counter 16 and, when the memories are not identical to each other, supplies an instruction for the drive of the aperture mechanism through the line $L_{23}$. The aperture mechanism set to the minimum aperture on the initial stage of drive increases in aperture when drive signal appears continuously in said line $L_{23}$. The aperture size thereof is mechanically fixed to the value obtained when the drive signal of the line $L_{23}$ stops. The aperture mechanism is so constructed that pulse signal may be supplied from a machine-electricity converting means such as an appropriate switch according to the variation of the aperture. The pulse signal is applied to said counter 16 through a line $L_{31}$ for the counting thereof.

When the number of pulse signal from the aperture mechanism agrees with the memory of the aperture register 13, the comparator 17 come not to feed driving signal to the aperture mechanism. Consequently, the aperture mechanism is set to the optimum aperture according to the digital signal of which the setting is previously made by the aperture register 13.

Numeral 18 designates a shutter register which reads and stores the digital signal corresponding to the shutter speed signal from the line $L_{10}$ under the control of the sequence control circuit 4 when the analog-to-digital converter generates the digital signal.

Numeral 19 is a counter for counting the clock signal from a clock generator 20 under the control according to the control signal from the sequence control circuit 4.

Numeral 20 is a comparator for comparing the digital signals of said shutter register 18 and counter 19 which controls the shutter mechanism by means of the output signal thereof fed to a line $L_{26}$.

The focal plane shutter in use has front and rear shutter blinds (neither thereof is illustrated) provided with a window at a different place. The front and rear shutter blinds are mechanically lifted up when photographic film is wound up and are fastened by a latch solenoids.

The sequence control circuit 4 drives the latch solenoid (not illustrated) for the front shutter blind through the medium of a line $L_{35}$.

The comparator 20 drives the latch solenoid for the rear shutter blind through the medium of a line $L_{26}$.

When driving current is allowed to flow in the latch solenoid for the front shutter blind according to the output of the sequence control circuit 4, the latch is released so that the front shutter blind starts running.

When driving current is fed to the line $L_{35}$, an instruction for operation start is given to a counter 19 from the sequence control circuit 4 through a line $L_{34}$. The counter 19 starts counting the clock signal from a clock generator 21.

After a fixed length of time has passed, the memory of the counter 19 agrees with that of a shutter register 18. At this time, the comparator 20 lets driving current flow in the latch solenoid for the rear shutter blind through the line $L_{26}$. Thereby, the latch is released so that the rear shutter blind starts running.

In a focal plane shutter, shutter time is determined depending on the difference of the start of running between the front and rear shutter blinds, i.e. on the memory of the shutter register 18 as described above.

When only the release switch $S_1$ is set to ON by handling the release button, the power switch circuit 1 is set to ON so that the feed of the various circuits mentioned above with power supply voltage is started. At the same time, an instruction for the start of control operation is given to the sequence control circuit 4 from the release switch $S_1$ through the line $L_1$.

When the power switch circuit 1 is set to ON, a battery check circuit 3 starts operation. When the voltage of the line $L_{51}$ has lowered below the detection level of the first voltage comparating circuit 31 which is illustrated in FIG. 1 in substantial details owing to the drop of the electromotive force of a battery E, an instruction for battery-level warning display is issued to the display driver through a line $L_5$.

When the voltage of the line $L_{51}$ has lowered below the detection level of the second voltage comparating circuit 32, an instruction for prohibiting the start of control operation is given to the sequence control circuit 4 through a line $L_4$. Namely, when the voltage has lowered below the lower limit of operation power supply voltage, the signal of the line $L_4$ comes to "0" level, and the NOR circuit (FIG. 1) in the sequence control circuit 4 receives level "1" signal from the inverter $IN_{01}$. The output of the NOR circuit $NR_{02}$ is kept to level "0" although the release switch $S_1$ is set to ON. Consequently, the instruction signal for the start of control operation will not be fed to a line $L_{40}$.

When the voltage level of the line $L_{51}$ is larger than the lower limit level of operation power-supply voltage, the level "1" signal corresponding to the ON position of the release switch $S_1$ is generated by said NOR circuit $NR_{02}$ to give an instruction for the start of control operation to the circuits (not illustrated) in the sequence control circuit 4.

First of all when the control of the sequence control circuit 4 starts, the analog shutter-speed signal of the line $L_{10}$ is transferred to a line $L_{12}$ through a analog switch 11. The shutter speed signal of the line $L_{12}$ is converted into a digital signal by the analog-to-digital converter 12. After conversion time has passed, an instruction for storing the digital signal is given to the shutter register 18 from the control circuit 4 through a line $L_{33}$.

Next, the analog switch 11 is changed over according to the control signal to a line $L_{27}$ so that the analog optimum-aperture signal from the line $L_{11}$ is transferred to the line $L_{12}$. This signal is converted into digital signal by the converter 12. After conversion time has passed, input control signal is fed to the aperture register 13 from the control circuit 4 through the line $L_{30}$ so that the aperture register 13 is fed with digitalized optimum-aperture signal.

If the release switch $S_2$ still remains unpressed when the first input of said two registers 18 and 13 is completed, the shutter speed signal of the line $L_{10}$ and the optimum-aperture signal of the line $L_{11}$ are stored in the shutter register 18 and the aperture register 13, respectively, through the analog switch 11 in the respective different periods under the control of the sequence control circuit 4 as described above. Consequently, the latest data are always stored in the registers 13 and 18 in response to the change of the scenes to be photographed and shutter speed.

As described before, the display driver 14 lights the LEDs corresponding to the F-number close to the optimum aperture signal of the aperture register 13 while the release switch $S_1$ is to ON. When said release switch $S_2$ is set to ON in succession to $S_1$ by handling the release button, the illumination of the LEDs is prohibited according to the display instruction signal fed from the sequence control signal through a line $L_{29}$, and the control of camera mechanism is started.

First of all, aperture mechanism is controlled so as to change the aperture thereof from opening aperture value to the optimum aperture value designated by the register 13 according to the output of the comparator 17 as described above.

Next, the start signal for the front shutter blind is fed to the latch solenoid from the sequence control circuit 4 through the line $L_{35}$. After a fixed time designated by the register 18 has elapsed, the signal for starting the rear shutter blind is fed thereto from the comparator 20.

The sequence control circuit 4 does not feed the signal for setting the power switch circuit 1 to ON to the line $L_{50}$ when only the release switch $S_1$ is set to ON but feeds said signal to said line $L_{50}$ for the period ranging from setting the release switch $S_2$ to ON to the completion of said shutter control when said release switch $S_2$ is set to ON. Since the power switch circuit 1 is controlled by the sequence control circuit 4 as described above, the interruption of the feed of the circuits with power supply voltage during sequence control operation is prevented and reliable photography is assumed even when the release switch $S_2$ is kept to ON for a shorter length of time than shutter time.

When the release switch $S_1$ is set to OFF by releasing the release button, the power switch circuit 1 is set to OFF so that the feed of power supply voltage to the various circuits mentioned above is stopped.

In the embodiment, the battery check circuit 3 and constant voltage circuit 2 are required to be the same as illustrated in FIGS. 1 and 2 respectively.

The first and second voltage detection outputs are applied to the display driver 14 and sequence control circuit 4 through the lines $L_5$ and $L_4$ respectively as described above.

The weak battery warning according to the first voltage detection output is performed by said LEDs for the display, etc. of F-number.

FIG. 5 is a detailed circuit diagram of the display driver 14.

As clarified by the following description, the circuit performs battery level warning by flickering the LED 160 or 169. The LEDs 160 and 169 are also flickered when the calculation result based on photometry indicates underexposure or overexposure. Therefore, due consideration is given that the difference between the two modes of display can be noticed by providing different flickering periods, when battery level warning and underexposure or overexposure are displayed simultaneously.

The circuit receives clock signals $\overline{TC6}$ and $\overline{TC7}$, bulb signal B, display instruction signal SR, the aperture signal from the aperture register 13, and battery-level warning signal BC, as input signals.

The clock signals $\overline{TC6}$ and $\overline{TC7}$ are the pulse signals supplied from the clock generator 21. $\overline{TC6}$ is 8 Hz in frequency for example and is required to be 50% in duty ratio. $\overline{TC7}$ is 4 Hz, a half of the supposed frequency, and is 50% in duty ratio.

The bulb signal B for displaying shutter opening can be obtained when bulb-displayed shutter-speed signal level in the line $L_{10}$ is detected by the detecting circuit 21. The signal B becomes "1" level when shutter opening is displayed.

The display instruction signal SR is fed from the sequence control circuit 4 (FIG. 3) to give an instruction for lighting the LEDs when being at level "1".

The battery-level warning signal BC obtained from said inverter shown in FIG. 1 comes to level "0" on warning.

A decoder 141 receives aperture signal from the aperture register 13 through the lines $L_{14}$-$L_{18}$, and feeds output signal to lines $L_{41}$, $L_{42}$, and $L_{00}$-$L_{09}$.

Said line $L_{41}$ selected on underexposure comes to level "1" when selected.

The line $L_{42}$ selected on overexposure comes to level "1" when selected.

The line $L_{00}$ or $L_{09}$ selected when the memory of the aperture register 13 displays the range of F1.4 or F22 comes to level "0" when selected. If F1.4 is displayed according to the memory of said register 13 for example, the line $L_{00}$ is selected and becomes "0".

Figure 6A:
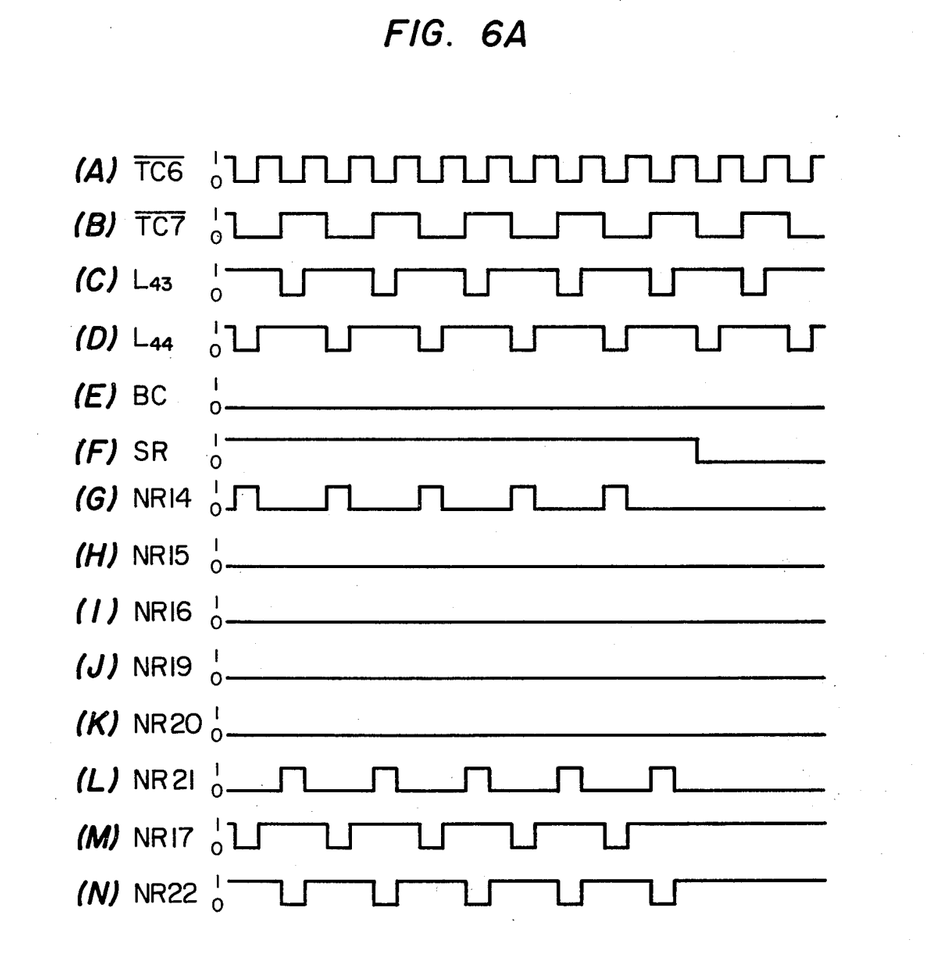

The logical circuit 140 to which the clock signals $\overline{TC6}$ and $\overline{TC7}$ are fed is employed to generate signals with a frequency of 4 Hz and a duty ratio of 25% and 180° different in phase as shown wave forms (C) and (D) in FIG. 6A. The signals of lines $L_{43}$ and $L_{40}$ are used to flicker the LEDs as described later. The signals therefore, are set to a comparatively low frequency as described above so that the flickering of the LEDs may not be recognized in error as continuous lighting owing to the after-imaging of eyes.

Numerals 144-153 are the output circuits connected to the LEDs 160-169 by the output terminals $P_0$-$P_9$ thereof respectively. The output circuits 144-153 have the same construction. Therefore, only the circuit of 144 is illustrated in FIG. 5 in details.

NOR circuits NR14-NR17 construct a gate circuit for the display of the LED 160 whose mode can be roughly divided into three. When the output of one at least of the NOR circuits NR14-NR16 comes to level "1" in said gate circuit 142, the output signal of the NOR circuit NR17, i.e. the input signal of the output circuit 144 comes to level "0" so that the LED 160 turns light on.

Similarly, NOR circuits NR19-NR22 construct a gate circuit 143. When the output of one at least of the NOR circuits NR19-NR21 comes to level "0", the LED 169 puts light on.

The NOR circuit NR13 prohibts the display of the signal fed to the lines $L_{00}$-$L_{09}$ from the decoder 141 when the output thereof comes to level "0". This prohibition is effected when display instruction signal SR is at level "0", bulb signal B is at level "1", the signal UNR in the line $L_{41}$ is at level "1" on underexposure, and the signal OVR in the line $L_{42}$ is at level "1" on overexposure.

Hereunder, the operation of the circuit shown in FIG. 5 is described in connection with the operational wave forms shown in FIGS. 6A-6C.

FIG. 6A shows the operation signal wave form obtained when the signals UNR, OVR, B and BC are at level "0", and the signals in the lines $L_{00}$ and $L_{09}$ are at level "1".

The decoder 141 is supposed to have selected $L_{01}$ for example out of the lines $L_{00}$-$L_{09}$, and the level thereof is supposed to be "0. The output signal of the NOR circuit NR13 comes to level "1" when instruction signal SR comes to level "1", whose wave forms are not illustrated in FIG. 6A. Therefore, the display of level "0" signal in the line $L_{01}$ is not prohibited so that the LED 161 illuminates.

The NOR circuit NR14 generates the signal whose phase is inverse to that of the signal of the line $L_{44}$ in the gate circuit 142 as shown in FIG. 6A(G) when level warning signal BC is at level "0".

The NOR circuit NR15 generates level "0" signal as illustrated in FIG. 6A(H) since the circuit receives the level "1" signal obtained by inverting the level "0" signal of the line $L_{41}$ by means of the inverter IN15.

The NOR circuit NR16 generates level "0" signal as shown in FIG. 6A(I) according to the level "1" signal of the line $L_{00}$.

The NOR circut NR17 generates output signal as shown in FIG. 6A(M) according to the output signal of said NOR circuits NR14-NR16.

The output circuit 144 lights the LEDs while the output of said NOR circuit NR17 is at level "0".

Similarly, the NOR circuit NR19 generates level "0" signal in the gate circuit 143 as shown in FIG. 6A(J) when the line $L_{09}$ is at level "0".

The NOR circuit NR20 generates level-"0" signal as shown in FIG. 6A(K) according to the level "1" signal of the inverter IN17. The NOR circuit NR21 synchronizes with the signal of the line $L_{43}$ to generate such signal as shown in FIG. 6A(L). The NOR circuit NR22 generates such signal as illustrated in FIG. 6A(N) according to the output signal of said NOR circuits NR19–NR21.

The output circuit 153 illuminates the LED 169 while the output signal of said NOR circuit NR22 is at level "0".

Thus, the LED 161 selected by the lines $L_{00}$–$L_{09}$ of the decoder 141 lights continuously. Simultaneously, the warning of battery-level warning signal BC is made by the alternate flickerings of the LED 160 at one end and the LED 169 at the other end.

When the display instruction signal SR from the sequence control circuit 4 comes to level "0", the outputs of the inverters IN13 and IN14 come to level "1" and that of the NOR circuit NR13 comes to level "0". Consequently, the respective input signals of the output circuits 144–153 are set to level "1" by said NOR circuits so that the all the LEDs are prohibited from lighting.

If said line $L_{00}$–$L_{09}$, not $L_{01}$, is selected according to the memory of the aperture register 13 (FIG. 3), battery level warning is made in the below-described manner.

Figure 6B:
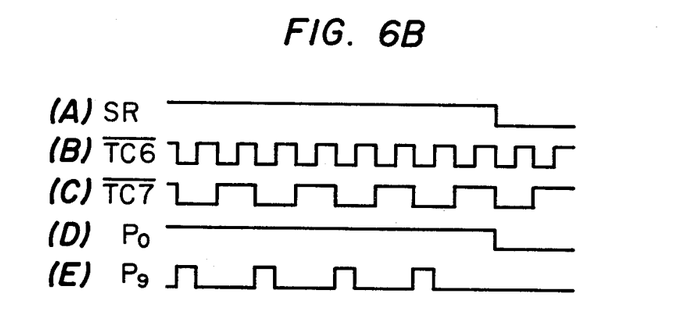

FIG. 6B shows the signal wave forms at the terminals $P_0$ and $P_9$ of the output circuits 144 and 153 that are obtained when the line $L_{00}$ comes to level "0".

While display instruction signal SR is at level "1", level "0" signal is applied to the NOR circuit NR16 of the gate circuit 142 from the inverter IN16. Since the signal of the line $L_{00}$ is at level "0", the NOR circuit NR16 generates level "1" contrary to the case shown in FIG. 6A so that the LED 160 illuminates continuously.

In the meanwhile, the LED 169 flickers since the signal applied to the gate circuit 143 does not differ from the case shown in FIG. 6A.

Namely in this case, optimum aperture is displayed by the continuous lighting of the LED 160 and battery level warning is made by the flickering of the LED 169.

The LED 160 or 169 flickers as described above in the case of underexposure or overexposure. The displays of underexposure or overexposure and of battery level warning differ in mode.

Figure 6C:
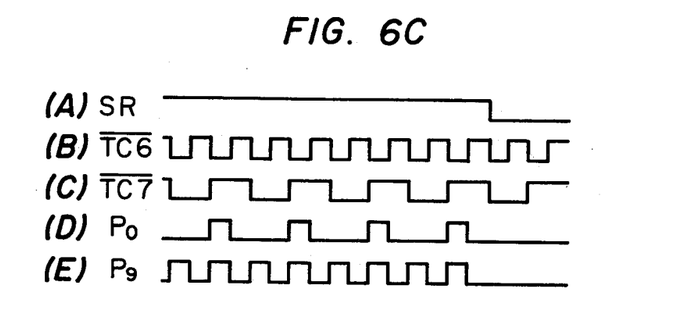

FIG. 6C shows the signal wave forms of the terminals $P_0$ and $P_9$ that are obtained when overexposure display is performed. On overexposure, only $L_{42}$ is selected out of the output lines $L_{41}$–$L_{42}$ and $L_{00}$–$L_{09}$ of the decoder 141. Namely, the lines $L_{00}$–$L_{09}$ are kept at level "1", and $L_{41}$ at level "0". The line $L_{42}$ comes to level "1".

In this condition, the output signal of the inverter IN17 comes to level "0" because the line $L_{42}$ is at level "1".

Consequently, the NOR circuit NR20 opens in the gate circuit 143 so that the inverse signal of the line $L_{44}$ is fed to the output thereof. The inverse signal of the line $L_{43}$ is fed to the NOR circuit NR21. Therefore, the pulse signal with a frequency of 8 Hz and a duty ratio of 50% is fed to the output of the NOR circuit NR22.

The signal in the gate circuit 142 does not differ from the case shown in FIG. 6A.

Consequently, the LED 160 flickers according to the signal with a frequency of 4 Hz and a duty ratio of 25% to supply battery level warning. The LED 169 flickers according to the signal with a frequency of 8 Hz and a duty ratio of 50% to display overexposure.

$LED_L$ and $LED_H$ flicker at 8 Hz and 4 Hz respectively when making underexposure and level-check displays.

Further, when bulb display becomes signal $(B) =$ "1", NOR gate circuits $NR_{16}$, $NR_{18}$ and $NR_{19}$ are closed to prohibit the input of the other signals than for level check.

According to the heretofore-described embodiment, the display unit for the other displays than that for warning battery replacement time is used in common for the latter also so that the quantity of externally fitted pins and parts can be reduced when the display unit is constructed into a monolithic IC.

Further, the circuit thereof can be simplified since the displays are discriminated from each other by providing different periods for the flickering of one display unit and the signal therefor is made by using pulse duty and phase difference.

If the present invention is applied to the monolithic IC for the cameras having an electronic-control shutter mechanism as described heretofore, the display circuit thereof can be simplified because display signal can be made by using the frequency-divided pulses for measuring the time for shutter speed, as well as a number of display informations can be obtained by the LEDs for aperture display and the quantity of externally fitted pins and parts can be reduced.

The present invention is not restricted to the above-described embodiment, and it can be considered that varied combinations can be developed of the methods or circuits for obtaining a plurality of display informations by the flickering of one display unit. Further, the construction of the circuits for the displays can be transformed variedly.

The invention can be applied extensively to battery-driven electronic systems.

I claim:

1. An electronic system for driving display means and a load means comprising:
    a battery;
    a battery check circuit for detecting the drop of the power-supply voltage from said battery to a comparatively low value above the lower limit of the operation voltage of said electronic system and for detecting the drop of said power-supply voltage from said battery to said lower limit;
    a sequence control circuit coupled to the electronic system and controlled by a first and a second switch and by the output of said battery check circuit; and
    a power switching means connected between said battery and said battery check circuit,
    wherein said first switch is set to the ON condition so as to start a first operation of said electronic system, wherein said second switch is thereafter set to the ON condition so as to start a second operation of said electronic system, wherein said power switching means is set to the ON condition by the ON condition of said first switch so that said battery check circuit is supplied with said power-supply voltage from said battery and said battery check circuit starts to detect said power-supply voltage, wherein said display means is controlled by said battery check circuit and said sequence control circuit to indicate internal information of said electronic system and battery-level warning information during said first operation of said electronic system based on the ON condition of said first switch when said power-supply voltage through said power switching means is lower than said comparatively low value, wherein said internal information is inherently derived by the function of said electronic system when the power supply voltage is higher than said lower limit, wherein said load means is driven by said electronic system in said second operation of said electronic system based upon the ON condition of said second switch when said power-supply voltage is higher than said lower limit, and wherein said battery check circuit prohibits said sequence control circuit from starting the second operation of said electronic system when said power-supply voltage from said power switching means is lower than said lower limit.

2. An electronic system as claimed in claim 1, wherein said power switching means includes a semiconductor device having a first and a second electrode and a control electrode, wherein the electrical conduction between said first and said second electrode is controlled by an electric signal applied to said control electrode, and wherein said first and said second electrodes are directly connected to said battery and the battery check circuit respectively and said control electrode is connected to said first switch.

3. An electronic system as claimed in claim 1, wherein a gate means coupled to said first switch is used to receive said detection signal from said battery check circuit of the power-supply voltage from said battery dropping to said lower level as a gate signal, and the operation of said electronic system is substantialy prohibited by prohibiting the signal which is generated by said ON condition of said first switch from passing said gate means.

4. An electronic system as claimed in claim 3, wherein said electronic system is provided to control as said load means the electronic-control shutter of a camera, and said gate means prohibits the output of said signal of said first switching from starting the control operation of said electronic system.

5. An electronic system as claimed in claim 1, wherein said electronic system includes means to detect light levels, and the internal information generated by said electronic system is an indication as to the optimum aperture setting for a camera for the detected light based on values of shutter speed, an ASA sensitivity, and the F-number of the camera lens which are preset into said electronic system.

6. A system according to claim 5, wherein the optimum aperture setting is indicated by continuous lighting of a display element and the warning signal is indicated by a flickering of a display element.

7. An electronic camera comprising:
a battery;
a first and a second release switch respectively interlocked with a release button of said electronic camera and successively set to the ON conditions by the depressing of said release button;
a shutter mechanism;
display means;
an electronic system which includes a photo sensing circuit, an arithmetic unit for computing optimum information for obtaining a proper photograph based upon the output of said photo sensing circuit, wherein said display means indicates information based upon said optimum information output of said arithmetic unit;

a battery check circuit for detecting the drop of the power supply voltage from said battery to a comparatively low value above the lower limit of the operation voltage of said electronic system and for detecting the drop of said power supply voltage from said battery to said lower limit;
a control circuit coupled to said electronic system which is controlled by said battery check circuit and by said first and said second release switch; and
a power switching means connected between said battery and said battery check circuit,
wherein said power switching means is set to the ON condition by the ON condition of said first release switch so that said battery check circuit is supplied with a power-supply voltage from said battery and said battery check circuit starts to detect said power-supply voltage, wherein said display means are controlled by said battery check circuit and said control circuit so as to indicate said information based upon said optimum information and battery-level warning information during the ON condition of said first release switch when said power-supply voltage from said power switch means is lower than said comparatively low value, wherein said shutter mechanism is controlled by said control circuit so as to commence the photographic operation based upon the ON condition of said second release switch, and wherein said battery check circuit prohibits said control circuit from starting the operation of said electronic system when said power-supply voltage from said power switching means is lower than said lower limit.

8. An electronic camera as claimed in claim 7, wherein said power switching means includes a semiconductor device having a first and a second electrode and a control electrode, wherein the electrical conduction between said first and second electrode is controlled by an electric signal applied to said control electrode, and wherein said first and said second electrodes are directly connected to said battery and the battery check circuit respectively and said control electrode is connected to said first release switch.

9. An electronic camera as claimed in claim 8, wherein said control circuit further comprises a gate circuit which receives the signal from said first release switch and the detector signal from said battery check circuit so as to prohibit the start of the control operation of said control circuit when said power-supply voltage from said power switching means is lower than said lower limit.

10. An electronic camera as claimed in claim 8, wherein said display means comprise a plurality of display elements and a selected one of said display elements flickers with a first frequency so as to indicate overexposure or underexposure based upon said optimum information, and wherein one of the other display elements flickers with a second frequency different from said first frequency so as to indicate said battery-level warning information for warning that said power-supply voltage drops below said comparatively low value.

11. A system according to claim 8, wherein the optimum information is the optimum aperture setting for a camera for the light sensed by the photo sensing circuit for values of shutter speed, ASA sensitivity and the F-number of the camera lens which are preset in the arithmetic unit.

12. A system according to claim 11, wherein the optimum aperture setting is indicated by continuous light of a display element and the warning signal is indicated by a flickering of a display element.

* * * * *

UNITED STATES PATENT AND TRADEMARK OFFICE
CERTIFICATE OF CORRECTION

PATENT NO. : 4,269,494
DATED : May 26, 1981
INVENTOR(S) : K. Shiozawa et al

It is certified that error appears in the above—identified patent and that said Letters Patent are hereby corrected as shown below:

The front page of the patent should indicate the following:

"Assignee: Konishiroku Photo Industry Co., Ltd., and Hitachi, Ltd."

Signed and Sealed this

Nineteenth Day of January 1982

[SEAL]

Attest:

GERALD J. MOSSINGHOFF

Attesting Officer     Commissioner of Patents and Trademarks